United States Patent [19]

Matsumura et al.

[11] Patent Number: 5,379,257

[45] Date of Patent: Jan. 3, 1995

[54] SEMICONDUCTOR INTEGRATED CIRCUIT DEVICE HAVING A MEMORY AND AN OPERATIONAL UNIT INTEGRATED THEREIN

[75] Inventors: Tetsuya Matsumura; Hiroshi Segawa; Kazuya Ishihara; Shinichi Uramoto; Masahiko Yoshimoto, all of Hyogo, Japan

[73] Assignee: Mitsubishi Denki Kabushiki Kaisha, Tokyo, Japan

[21] Appl. No.: 767,767

[22] Filed: Sep. 30, 1991

[30] Foreign Application Priority Data

Nov. 16, 1990 [JP] Japan .................................. 2-311973

[51] Int. Cl.$^6$ ............................................. G11C 13/00
[52] U.S. Cl. ........................... 365/189.01; 365/189.05; 395/425
[58] Field of Search ...................... 365/189.01, 189.05, 365/189.09, 189.07; 364/DIG. 1; 395/425, 132, 166

[56] References Cited

U.S. PATENT DOCUMENTS

| | | | |
|---|---|---|---|
| 4,041,461 | 8/1977 | Kratz et al. | 364/DIG. 1 |
| 4,314,333 | 2/1982 | Shigayama et al. | 364/DIG. 1 |
| 4,314,349 | 2/1982 | Batcher | 364/716 |
| 4,823,286 | 4/1989 | Lumelsky et al. | 395/166 |
| 4,959,815 | 9/1990 | Wada | 365/189.01 |
| 4,975,868 | 12/1990 | Freerksen | 364/748 |
| 5,093,807 | 3/1992 | Hashimoto et al. | 365/230.09 |

Primary Examiner—Terrell W. Fears
Attorney, Agent, or Firm—Lowe, Price, LeBlanc & Becker

[57] ABSTRACT

A semiconductor integrated circuit device includes a memory cell array for storing data to be processed, and an operational unit for effecting a predetermined operation on the data read from the memory cell array. The memory cell array has first and second regions for storing first and second data words of first and second groups. The first data words and second data words each include a plurality of data bits. The first region includes a plurality of bit arrays for storing data bits of the same digit in the first data words, and the second region includes a plurality of bit arrays for storing data bite of the same digit in the second data words. The bit arrays of the first and second groups are arranged alternately in the order of digits of the data words. The bit arrays storing the data bits of the same digit form one subarray. The data bits in one data word are stored in the same positions of the bit arrays. The operational unit includes operational circuits each corresponding to one of the subarrays. Each operational circuit effects the predetermined operation on the data read from the two bit arrays in the corresponding subarray. Each bit array has selectors responsive to external addresses to select one column from each bit array and connect this column to a corresponding operational circuit.

38 Claims, 9 Drawing Sheets

SEMICONDUCTOR INTEGRATED CIRCUIT DEVICE HAVING A MEMORY AND AN OPERATIONAL UNIT INTEGRATED THEREIN

BACKGROUND OF THE INVENTION

1. Field of the Invention

This invention relates to a semiconductor integrated circuit device in which a semiconductor memory and an operational circuit are integrated.

2. Description of the Background Art

Various operations are carried out on data in a digital signal processing (DSP) application or in a microprocessor. Data to be processed are stored in registers. These data are read from the registers for desired processing.

FIG. 1 is a diagram showing an ordinary digital signal processing system. In FIG. 1, the processing system includes a control circuit 500 for generating various control signals, registers 501 and 502 for writing and reading data under control of the control circuit 500, and an operational unit 503 for carrying out a desired operation on the data stored in these registers 501 and 502.

Where this processing system is a microprocessor, the control circuit 500 decodes a given command and generates various control signals for executing the command. In DSP application, a given signal is decoded to generate control signals necessary for an operation to be carried out between the registers 501 and 502, and the operational unit 503. The control circuit 500, registers 501 and 502 and operational unit 503 are interconnected through a bus 504. Then, the way in which this system works will be described briefly.

It is assumed here that the data are read from the registers 501 and 502 and then processed by the operational unit 503. In this case, the control circuit 500 outputs, through the bus 504, signals (register pointers) for selecting data in the registers 501 and 502 and a control signal for setting the registers 501 and 502 to a read mode. As a result, the selected data are transmitted from the registers 501 and 502 through the bus 504 to the operational unit 503. The operational unit 503 carries out a predetermined operation on the data read-out and outputs a result of the operation to the bus 504. The operation result output to the bus 504 is transferred to another functional block for use therein, stored in a register (501 or 502, or a different register not shown), or output externally.

In such a processing system, a circuit block for carrying out operations on input data is often constructed as one unit where the operations are of a fixed nature.

FIG. 2 is a diagram showing a conventional semiconductor integrated circuit device embodying the digital signal processing system unit described above, which shows schematically a unit for implementing a function to carry out predetermined operations on the data stored in two memories. In FIG. 2, a semiconductor integrated circuit device 600 includes a first memory 100 and a second memory 101. The first memory 100 and second memory 101 are used as registers for storing data to be processed, and correspond to the registers 501 and 502 in FIG. 1.

The first memory 100 includes a memory cell array 100c having a plurality of memory cells for storing data arranged in a matrix of rows and columns, a decoder 100d responsive to a first address ADA for selecting corresponding memory cells in the memory cell array 100c, an input circuit 100a for receiving an input data DIA, generating an internal input data, and writing the data into the memory cells selected by the decoder 100d, and an output circuit 100b for reading a data from the memory cells in the memory cell array 100c selected by the decoder 100d and outputting the data to an exterior of the memory 100. The input data DIA has an n-bit width, and the memory cell array 100c has an m words by n bits structure. The decoder 100d selects one word of n bits. Consequently, the output data DOA output from the output circuit 100b is of n bits also.

The second memory 101 has a construction similar to the first memory 100, and includes a memory cell array 101c having an m-word by n-bit structure, a decoder 101d for decoding a second address ADB and selecting a word (n bits) from the memory cell array 101c, an input circuit 101a for receiving an input data DIB, generating an internal input data, and writing the data into the word (memory cells) in the memory cell array 101c selected by the decoder 101d, and art output circuit 101b for reading a word selected by the decoder 101d from the memory cell array 101c and generating an output data DOB.

Whether the addresses ADA and ADB each include both a row address and a column address or include only a row address is dependent on the structure of the memory cell arrays 100c and 101c. Where a plurality of words are connected in each row in the memory cell arrays 100c and 101c, the addresses ADA and ADB each include both a row address and a column address. Where memory cells corresponding to one word are connected in each row of the memory cell arrays 100c and 101c, the addresses ADA and ADB each include a row address only.

The semiconductor integrated circuit device 600 further includes an operational unit 102 for receiving the output data DOA from the first memory 100 and the output data DOB from the second memory 101, and carrying out a predetermined operation thereon to generate a result data DOS. This operational unit 102 corresponds to the operational unit 503 shown in FIG. 1, and may be an adder, a multiplier or a logic unit. The result data DOS output from the operational unit 102 is of n bits in the illustrated example. The first memory 100 and second memory 101 have the structure of a random access memory (RAM) capable of data writing and reading in random sequence. The way in which this device works will now be described briefly.

The input data DIA and input data DIB are provided from an exterior of the integrated circuit device 600. The input data DIA and DIB may be output data of two sensors supplied through separate routes, or may be two types of data output from different functional units under control of a control block such as the control circuit 500 shown in FIG. 1. A data writing operation will be described first.

The first memory 100 and second memory 101 carry out the same operation as does an ordinary RAM. In the first memory 100, the externally supplied first address ADA causes the decoder 100d to select one word corresponding thereto in the memory cell array 100c. Subsequently, the n-bit input data DIA is converted to internal input data through the input circuit 100a, which is written into the selected n-bit word.

In the second memory 101, as in the first memory 100, the decoder 101d decodes the second address ADB to select one word in the memory cell array 101c. The n-bit input data DIB is written into this selected word through the input circuit 101a.

An operation for reading data from the first and second memories 100 and 101 will be described next. When the first address ADA is supplied, the decoder 100d selects one word (n bits) in the memory cell array 100c. After the one word (n bits) in the memory cell array 100c is selected, the output circuit 100b is enabled, and the n-bit output data DOA is output to an external of the memory 100 through the output circuit 100b.

Similarly, in the second memory 101, the decoder 101d selects one word (n bits) in the memory cell array 101c in response to the second address ADB. Then, the output circuit 101b is enabled to read out data from the selected one word and output the n-bit output data DOB to an external of the memory 100.

The operational unit 102 receives these output data DOA and DOB, carries out the predetermined operation thereon, and outputs the result data DOS (n bits).

By using the semiconductor integrated circuit device described above, operations may be carried out between the group of data A stored in the first memory 100 and the group of data B stored in the second memory 101. If the operational unit 102 is an adder, for example, the following operation may be performed:

$$Ak + Bj = Ci$$

where Ak and Bj are the k-th and j-th words in the groups of data A and B, respectively, and Ci is the i-th data in a group of output data.

If the operational unit 102 is comprised of a multiplier and an accumulator, with the first memory 100 and second memory 101 storing matrix data A and B, respectively, the following matrix operation may be performed:

$$\Sigma Aij \cdot Bjk = Cik$$

where Aij is a data word in the i-th row and j-th column of the matrix A, Bjk is a data word in the j-th row and k-th column of the matrix B, and Cik is a data word in the i-th row and k-th column of a resultant product matrix.

In the conventional semiconductor integrated circuit device described above, the first memory, second memory and operational unit must be arranged separately as shown in FIG. 3. FIG. 3 is a diagram schematically showing a layout of the first memory, second memory and operational unit in the integrated circuit device 600.

The case is considered now in which respective circuit blocks, i.e. the first memory 100, second memory 101 and operational unit 102, are arranged separately as shown in FIG. 3. The operational unit 102 receives the two inputs each in n bits. Memory cells corresponding to a plurality of words are usually connected in each row in the first and second memories 100 and 101. Thus, the operational unit 102 has a smaller width than the memories 100 and 101, which gives rise to the problem that regularity cannot be secured for the layout within the integrated circuit device 600.

That is, the sum of the widths (horizontal directional lengths in FIG. 3) of the first memory 100 and second memory 101 is greater than the width of the operational unit 102. Thus, if the operational unit 102 is disposed in a position equidistant from the first memory 100 and second memory 101, empty regions E1 and E2 are present in the semiconductor integrated circuit device 600 as shown in FIG. 3. It means that the semiconductor integrated circuit device 600 has a low efficiency of chip area utilization, causing an obstacle to large scale integration.

Even where each row in the first memory 100 and second memory 101 represents one word, that is to say memory cells of n bits are connected in each row, the sum of the widths of the first memory 100 and second memory 101 is greater than the width of the operational unit 102 since the first memory 100 and second memory 101 require peripheral circuits such as the decoder circuits for selecting memory cells. Consequently, as in the foregoing case, regularity cannot be secured for the layout.

Further, the first memory 100 and second memory 101 are connected to the operational unit 102 through relatively long interconnection lines L1 and L2, respectively. This causes the problem of signal delays due to the lines L1 and L2, resulting in slow processing speed. The lines L1 and L2 have different lengths particularly where another control circuit is disposed in one of the empty region E2 shown in FIG. 3, with the operational unit 102 displaced toward the other empty region E1, in order to improve the layout regularity. In this case, the processing speed of the integrated circuit device is determined by the delay due to the longer interconnection line, hence processing is further retarded.

In DSP application or in a microprocessor, the semiconductor integrated circuit device 600 is integrated on a single chip with other functional blocks (functional units) as shown in FIG. 4. If the semiconductor integrated circuit device lacks in layout regularity as noted above, the functional blocks 650 and 651 and other devices cannot be arranged in high density on the semiconductor chip 700. Thus, it is impossible to realize a high dense large-scale integration circuit device.

Where such a semiconductor integrated circuit device is used in DSP application in particular, the functional blocks 650 and 651 are often formed of gate arrays, and a highly dense and highly integrated gate array logic cannot be realized. Further, if the processing speed of such a large-scale integration circuit device is determined by the operating speed of the semiconductor integrated circuit device 600, the latter being slowed by the delays due to the interconnection lines as noted above, then the processing speed of the large-scale integration circuit formed on this chip 700 must become slow also.

SUMMARY OF THE INVENTION

An object of the present invention is to provide an improved semiconductor integrated circuit device which eliminates the disadvantages of the conventional semiconductor integrated circuit device.

Another object of the present invention is to provide a semiconductor integrated circuit device occupying only a small area and yet operable at high speed.

A further object of the present invention is to provide a semiconductor integrated circuit device having a high degree of layout regularity.

A semiconductor integrated circuit device according to the invention includes a memory cell array having a plurality of memory cell groups. Each of the memory cell groups includes a plurality of bit arrays each having memory cells arranged in a matrix form of at least one column and a plurality of rows. The bit arrays of each memory cell group are arranged alternately with the bit arrays of another memory cell group.

The semiconductor integrated circuit device according to the invention further includes a plurality of selectors corresponding to the memory cell groups, and responsive to an address signal for selecting memory cells from a corresponding memory cell group; and an operational unit for receiving information stored in the memory cells in at least one memory cell group, and carrying out a predetermined operation thereon.

In the semiconductor integrated circuit device of this invention, the bit arrays of each memory cell group are arranged alternately with those of other memory cell group in the memory cell array.

Consequently, operational circuits included in the operational unit and corresponding to respective bits may be arranged to correspond to the bit arrays in the memory cell array. This secures regularity in a layout in this semiconductor integrated circuit device, and improves use efficiency of a chip area.

Since the operational circuits constituting the operational unit may be arranged to correspond to the bit arrays in the memory cell array, the operational unit and memory cell array are interconnected through minimal interconnection lengths for transmission of data of selected cells to the operational unit, thereby minimizing signal delays.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
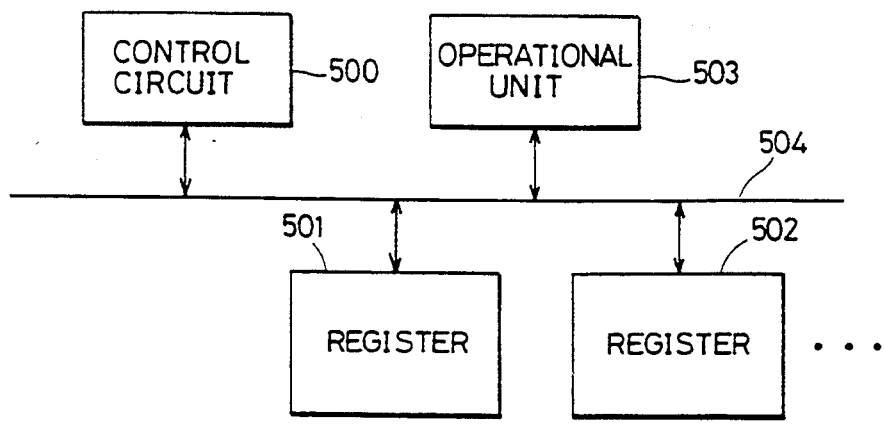
FIG. 1 is a diagram schematically showing an ordinary data processing system.
Figure 2:
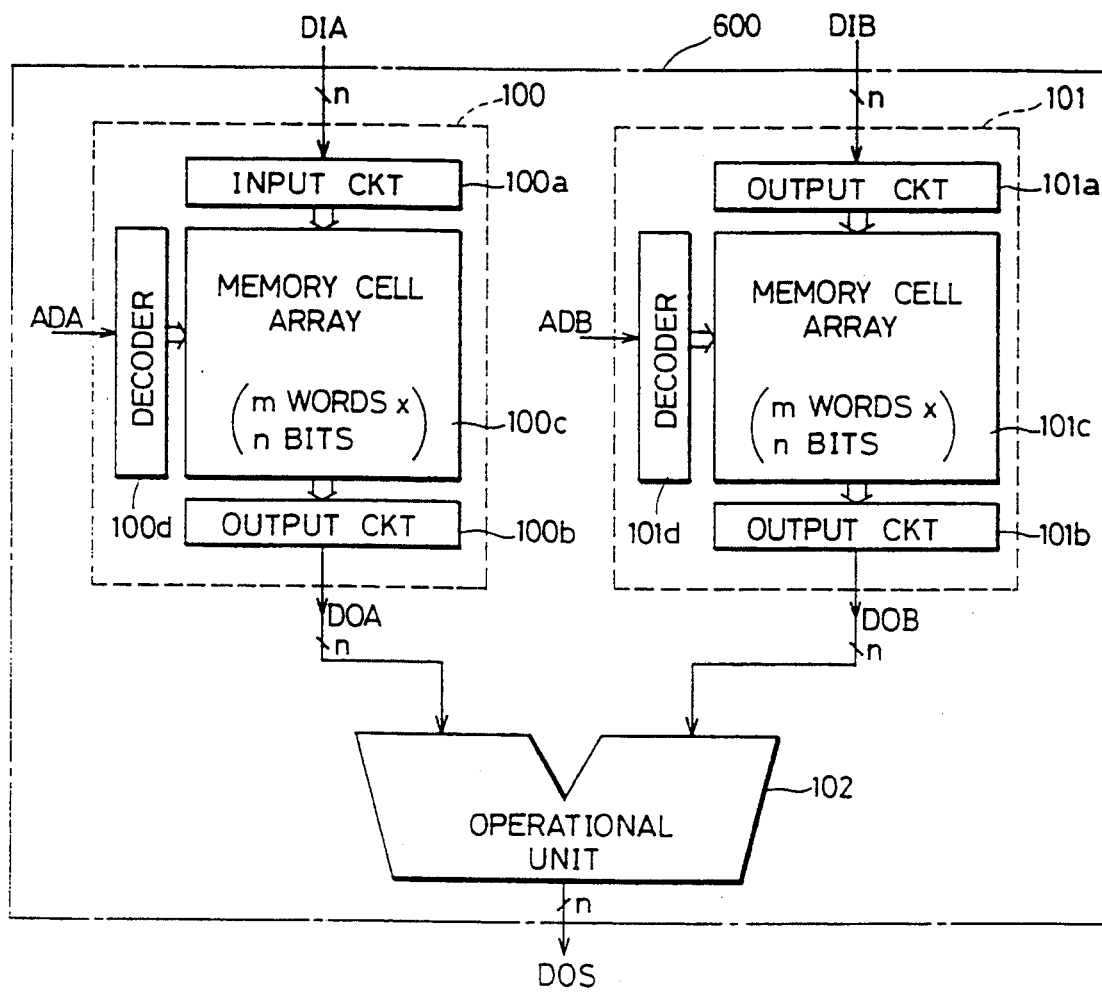
FIG. 2 is a diagram schematically showing a conventional semiconductor integrated circuit device for processing two kinds of data.
Figure 3:
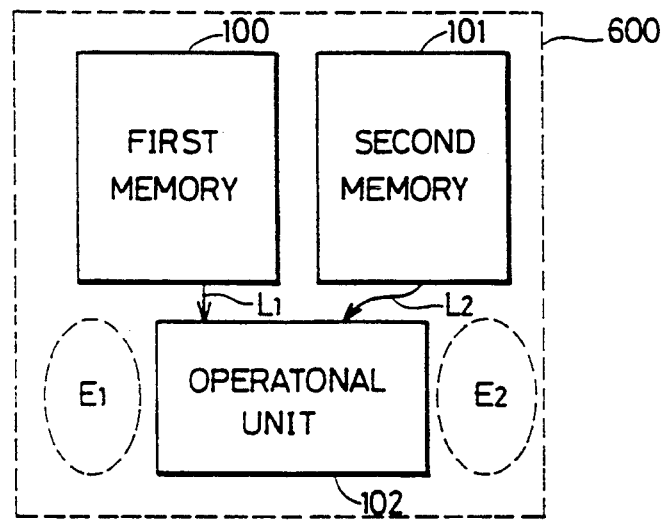
FIGS. 3 and 4 are diagrams used for illustrating the problems of the semiconductor integrated circuit device shown in FIG. 2.
Figure 4:
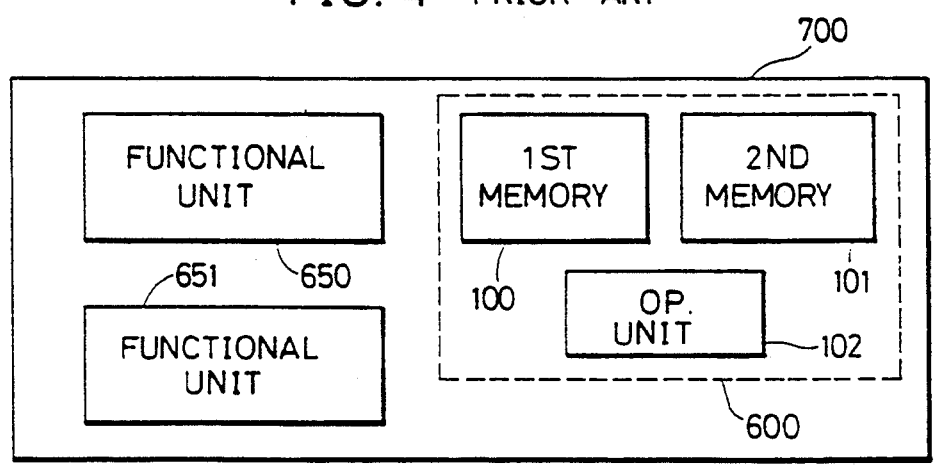
Figure 5:
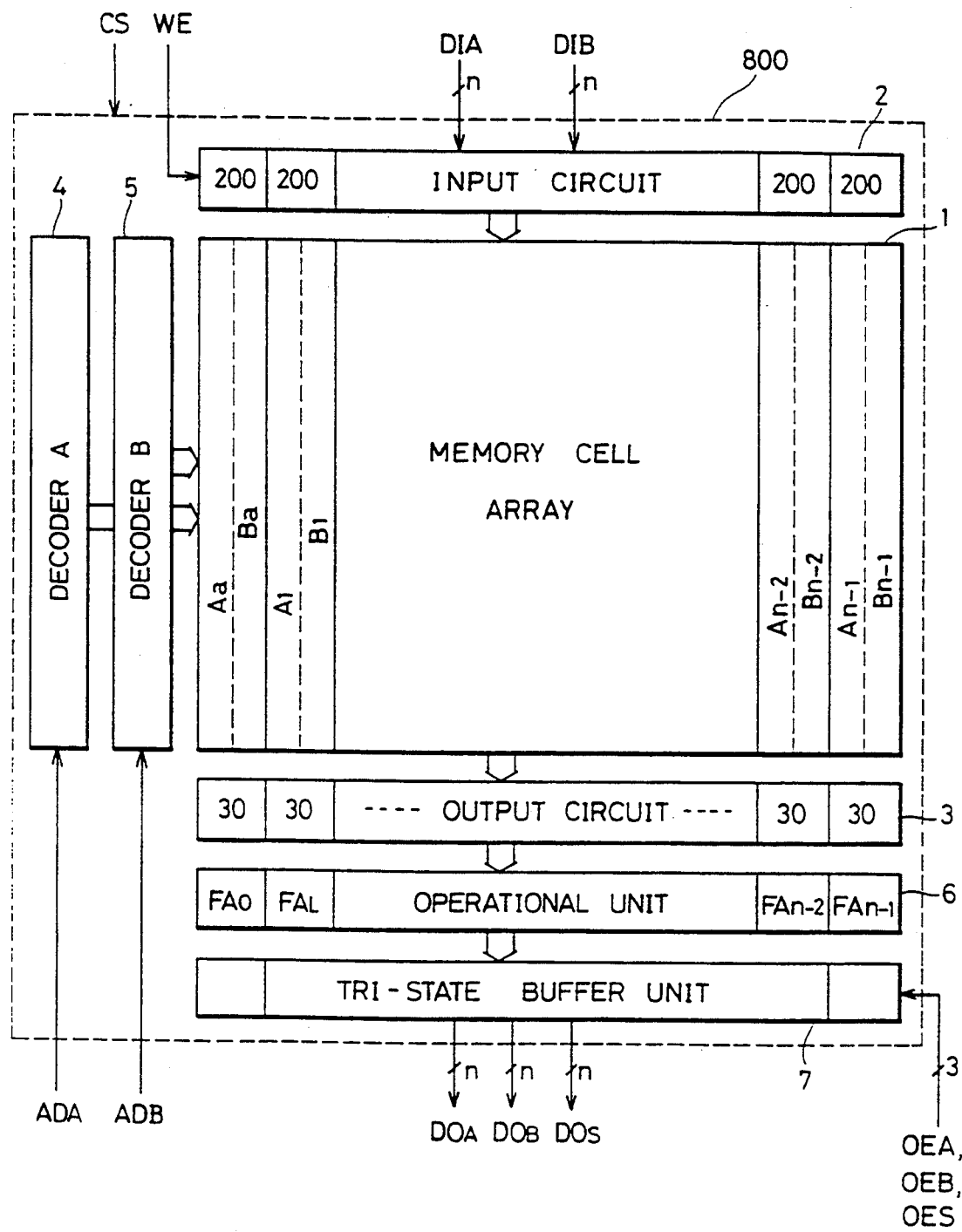
FIG. 5 is a diagram schematically showing an overall construction of a semiconductor integrated circuit device according to one embodiment of this invention.

FIG. 5 is a diagram schematically showing an overall construction of a semiconductor integrated circuit device according to an embodiment of this invention. The semiconductor integrated circuit device 800 includes a memory cell array 1 having a plurality of memory cells in a first group A and a plurality of memory cells in a second group B arranged in a mixed state. In the memory cell array 1, bit arrays comprised of memory cells in the first group A and bit arrays comprised of memory cells in the second group B are arranged alternately. A bit array is an array of data bits constituting the same digit in data words (hereinafter simply called words). Where, for example, a plurality of words are arranged in one row of the memory cell array, delta bits constituting the same digit in these words are arranged in one column of a bit array.

A bit array Ai stores an i-th bit data of each word in the first group A. A bit array Bi stores an i-th bit data of each word in the second group B. The "i" used herein is an integer from zero through $n-1$, and one word has n bits. The bit array Ai and bit array Bi are arranged alternately. Where the memory cells of p words for each are connected in one row, the number of columns in the memory cell array is $2 \times p \times n$, and each of the bit arrays Ai and Bi has p columns.

This semiconductor integrated circuit device 800 further includes a first decoder A 4 responsive to a first address ADA to select me word of a total of n bits, one bit being taken from each of the bit arrays A0 to $An-1$ in the memory cell array 1, a second decoder B 5 responsive to a second address ADB to select one word of a total of n bits, one bit being taken from each of the bit arrays B0 to $Bn-1$ in the memory cell array 1, an input circuit 2 for writing input data DIA and DIB into the respective words selected by the first decoder A 4 and second decoder B 5, and an output circuit 3 for reading data of the respective words selected by the first decoder A 4 and second decoder B 5.

The input circuit 2 includes n unit input circuits 200. Each unit input circuit 200 corresponds to two bit arrays Ai and Bi of the respective groups in the memory cell array 1. Each unit input circuit 200 transmits one bit in each of the input data DIA and DIB to a corresponding bit array.

The output circuit 3 also includes unit output circuits 30 each corresponding to two bit arrays Ai and Bi of the groups A and B. Each unit output circuit 30 outputs a data of two bits in total, one bit being taken from each of corresponding bit arrays Ai and Bi. Thus, the input circuit 2 and output circuit 3 each have a width of 2n bits for inputting and outputting two kinds of n-bit data simultaneously. The input circuit 2 has its writing operation controlled by a write enable signal WE.

The semiconductor integrated circuit device 800 further includes an operational unit 6 for receiving the output data from the output circuit 3 and outputting data resulting from a predetermined operation thereon, and a group of tri-state buffers 7 for receiving the result data from the operational unit 6 and outputting the result data in response to output enable signals OEA, OEB and OES. The operational unit 6 carries out additions of received data in the illustrated example, and includes an adding circuit FAi corresponding to the bit arrays Ai and Bi. The adding circuit FAi is full adder which receives and adds 2-bit data from the corresponding bit arrays in the two groups.

The group of tri-state buffers 7 includes buffers corresponding to operational circuits FAi for outputting data DOA read out from the first group A, data DOB read out from the second group and result data DOS. Output timing of the tri-state buffers 7 and the kind of data to be output are specified by the control signals OEA, OEB and OES. This group of tri-state buffers 7 sets the outputs DOA, DOB and DOS to a high impedance state when the output enable signals OEA, OEB and OES are in a disable state.

By arranging the unit input circuits 200 of the input circuit 2, the unit output circuits 30 of the output circuit 3, the operational circuits FAi of the operational unit 6, and the tri-state buffers in a manner to correspond to the respective bit arrays in the memory cell array 1 (bit slice arrangement) as described above, regularity is secured in the layout of this semiconductor integrated circuit device, which implements a construction integrating the semiconductor memories and operational units efficiently within a small occupying area.

A signal CS applied to this semiconductor integrated circuit device 800 is a control signal for selecting semiconductor memories to enable data write/read operations.

Figure 6:
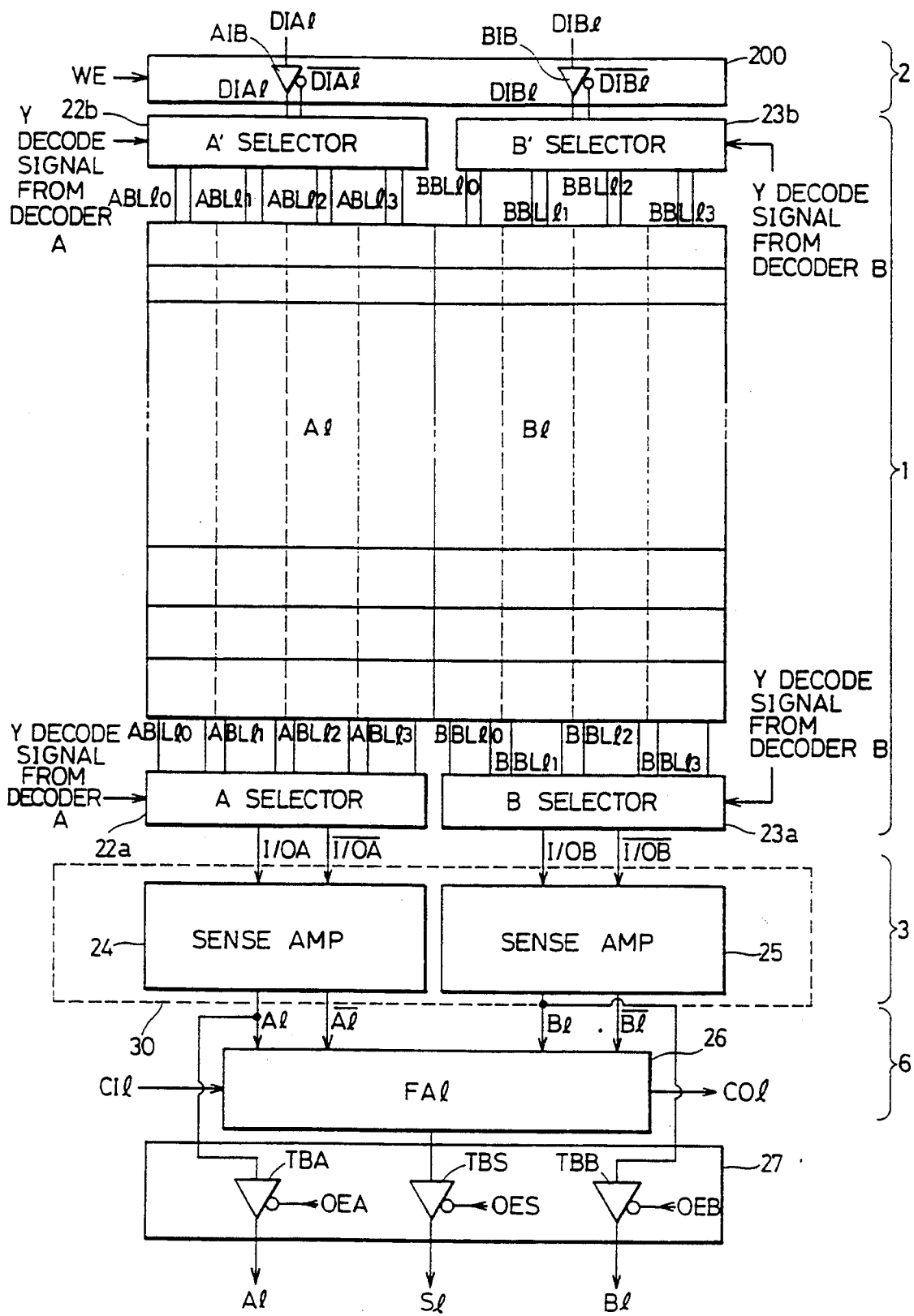
FIG. 6 is a diagram showing a portion relating to an l-th bit of a memory cell array in the semiconductor integrated circuit device shown in FIG. 5.

FIG. 6 is a diagram showing bit arrays of the lth bit and portions pertaining thereto of the semiconductor integrated circuit device shown in FIG. 5. In FIG. 6, a bit array Al and a bit array Bl are arranged adjacent to each other. Each of the bit array Al and bit array Bl is comprised of four columns. This arrangement is provided for a case in which the memory cell array 1 has data of four words in each group arranged in a single row. The number of columns included in each bit array is determined by the number of words connected in one row.

Bit lines ABLl0, ABLl1, ABLl2 and ABLl3 are arranged for selection of columns in the bit array Al. Similarly, bit lines BBLl0, BBLl1, BBLl2 and BBLl3 are arranged for selection of columns in the bit array Bl. The illustrated bit line structure of the memory cell array 1 is in the form of a bit line pair, which is based on the assumption of a complementary bit line pair structure for receiving mutually complementary data.

The bit array Al further includes an A selector 22a for selecting a column in the bit array Al in a data reading, and an A′ selector 22b for selecting a column in the bit array Al in a data writing. These A selector 22a and A′ selector 22b select one column (bit line) in response to a Y decode signal which is a column select signal from the decoder A 4 shown in FIG. 5.

Similarly, the bit array Bl includes a B selector 23a for selecting a column in the bit array Bl in a data reading, and a B′ selector 23b for selecting a column in the bit array Bl in a data writing. These B selector 23a and B′ selector 23b select one column (bit line) in response to a Y decode signal which is a column select signal from the decoder B 5 shown in FIG. 5.

The output circuit 3 includes, as one unit output circuit 30, a sense amplifier circuit 24 for receiving data from the memory cells selected by the A selector 22a through data lines I/OA and $\overline{I/OA}$ and differentially amplifying signals received, and a sense amplifier circuit 25 for receiving data from the memory cells selected by the B selector 23a through data lines I/OB and $\overline{I/OB}$ and differentially amplifying signals received. The sense amplifier circuits 24 and 25, as illustrated, differentially amplify complementary signals since the bit line structure of the memory cell array 1 is a complementary bit line pair structure, as in an ordinary RAM, in which, with selection of one column, complementary data are selected by the A selector 22a or B selector 23a. These sense amplifier circuits 24 and 25 are activated when the semiconductor integrated circuit device is in a data read mode. Where the memory cells included in the memory cell array 1 are dynamic RAM cell having a cell structure including a capacitor, a sense amplifier is provided for each bit line pair of the memory cell array 1 separately from the sense amplifier circuits 24 and 25. Where the memory cells are of ECLRAMs (emitter-coupled RAMs) or static RAMs, the sense amplifier circuits 24 and 25 are the same as ordinary sense amplifiers thereof.

The input circuit 2 includes, as one unit input circuit 200, an input buffer AIB for receiving an input data DIAl and generating an internal input data DIAl and $\overline{DIAl}$, and an input buffer BIB for receiving an input data DIBl and generating an internal input data DIBl and $\overline{DIBl}$. The unit input circuit 200 is activated to generate the internal input data in response to the write enable signal WE. When the write enable signal WE is in a disable state, the outputs of the unit input circuit 200 (buffers AIB and BIB) are placed in a high impedance state. The internal input data generated by the input buffer AIB is applied to the A′ selector 22b, while the internal input data generated by the input buffer BIB is applied to the B′ selector 23b. In a data writing, the A′ selector 22b selects one column in the bit array Al in response to the Y decode signal from the decoder 4, and transmits the internal input data from the input buffer AIB to the selected column. The B′ selector 23b selects one column in the bit array Bl in response to the Y decode signal from the decoder 5, and transmits the internal input data generated by the input buffer BIB to the selected column.

The A selector 22a and B selector 23a provided in the reading section and the A′ selector 22b and B′ selector 23b provided in the writing section may be in an operative state in a data reading as well in a data writing, or only in a data reading or data writing, respectively.

Where the A′ selector 22b and B′ selector 23b in the writing section are in the operative state in a data reading also, data reading is not affected as far as the outputs of both input buffers AIB and BIB are placed in the high impedance state. Thus, as illustrated, the input buffers AIB and BIB are tri-state buffers whose output state is controllable by the write enable signal WE.

Where the A selector 22a and B selector 23a in the reading section are in the operative state in a data writing, adverse influences on data writing with regard to current consumption and other aspects are avoided by placing the sense amplifier circuits 24 and 25 in an inoperative state. This scheme may be inferred from the construction of an ordinary static random access memory.

Even where the memory cell array 1 is comprised of dynamic random access memory cells, data reading and writing are not affected at all since the bit arrays Al and Bl include internal sense amplifiers provided corresponding to the bit lines and the sense amplifier circuit 24 and sense amplifier circuit 25 may be used as main amplifiers for further amplifying the data amplified the sense amplifiers inside the array.

An operational circuit 26 is comprised of a full adder FAl for receiving and adding data Al and $\overline{Al}$ and data Bl and $\overline{Bl}$ from the sense amplifier circuits 24 and 25. This adding circuit 26 receives a carry output CIl of a lower bit adding circuit as a carry input, and transmits its own carry output COl to a higher bit adding circuit.

A tri-state buffer circuit 27 includes a tri-state buffer TBS for receiving output of the adding circuit 26, a tri-state buffer TBA for receiving the output data Al from the sense amplifier circuit 24, and a tri-state buffer TBB for receiving the output data Bl from the sense amplifier circuit 25. Operation of the tri-state buffer TBS is controlled by the output enable signal OES. Operation of the tri-state buffer TBA is controlled by the output enable signal OEA. Operation of the tri-state buffer TBB is controlled by the output enable signal OEB. Output data Al, Sl and Bl of these tri-state buffers TBA, TBS and TBB are output to an external of the device.

Where the adding circuit 26 is a full adder, a carry is output from an adding circuit of the most significant bit. A further tri-state buffer for the carry output may be provided to indicate presence or absence of an overflow in the output from the most significant bit adding circuit. More precise operations are assured by controlling this over-flow indicating tri-state buffer with the output enable signal OES.

Not only the operation (addition) result output but the data may also be read out together from the first group A and second group B by using the output enable signals OES, OEA and OEB. This provides a very versatile semiconductor integrated circuit device.

Figure 7:
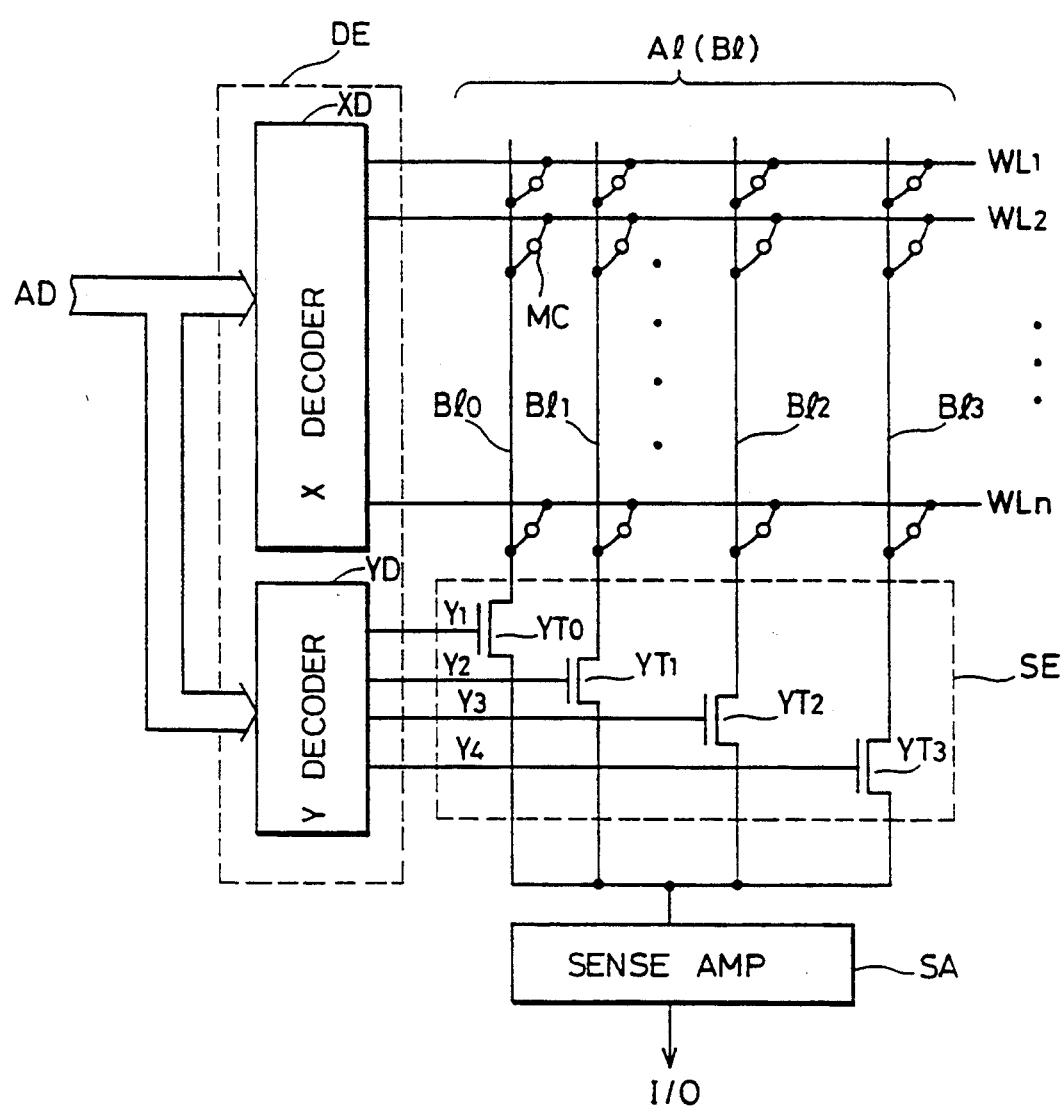
FIG. 7 shows more specifically the arrangement of FIG. 6.

Referring to FIG. 7, there is shown a specific arrangement of a bit array Al (or Bl).

Bit array Al (or Bl) includes a plurality (n) of word lines WL1 through WLn and 4 bit lines Bl0 through Bl3. In FIG. 7, a bit line Bli (i=0 to 3) is shown including a pair of complementary bit lines, for simplification of the drawings. Memory cell MC is disposed at respective interconnections of word lines WL1 through WLn and bit lines Bl0 through Bl3.

Decoder (decoder A or decoder B) DE includes X decoder XD and Y decoder YD. X decoder XD receives an address input AD (more precisely, a row address) to decode thus received address and select a corresponding word line among the word lines WL1 through WLn. Y decoder YD receives the address input AD (more precisely, a column address) to decode thus received address input and generate a column select signal Yi (i=0 through 3).

Selector SE includes column select gates YT0 through YT3 provided correspondingly for the bit lines Bl0 through Bl3. Column select gates YT0 through YT3 receives at their gates column select signal from Y decoder YD. One of the column select gates YT0 through YT3 turns on in response to a column select signal from YD, so that one bit line is selectively coupled to a sense amplifier SA (24 or 25 in FIG. 60).

Figure 8:
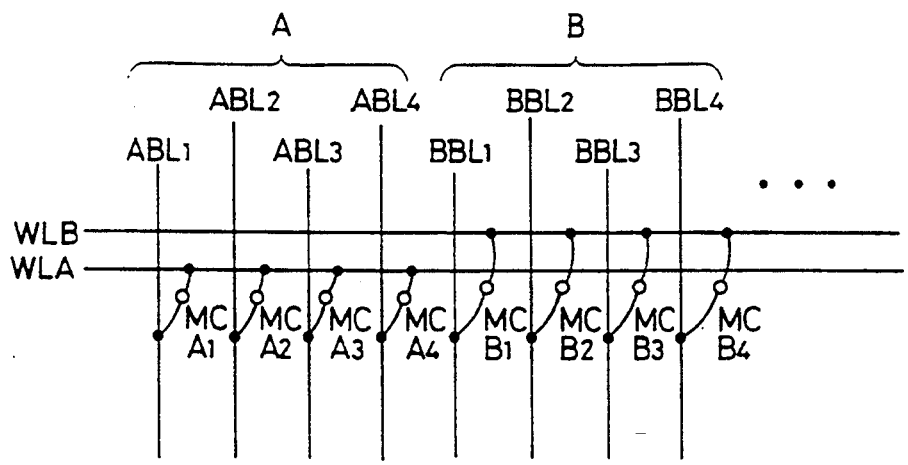
FIG. 8 is a diagram showing an example of arrangement of memory cells in bit arrays of the memory cell array shown in FIG. 5.

FIG. 8 is a diagram showing an example of arrangement of memory cells in one row of the bit arrays shown in FIG. 6. In FIG. 8, memory cells MCA storing the data of group A in FIG. 5 are connected to a word line WLA which is placed in a select state by the output of the decoder A 4. Memory cells MCB storing the data of group B are connected to a word line WLB which is placed in a select state by the output of the decoder B 5. The memory cells MCA1-MCA4 output the stored data onto the bit lines ABL1-ABL4, respectively, when the word line WLA is in the select state. The memory cells MCB1-MCB4 output the stored data onto the bit lines BBL1-BBL4, respectively, when the word line WLB is in the select state. For simplicity of illustration, FIG. 8 shows each bit line as a single line and not in a complementary pair.

As shown in FIG. 8, the first group selecting word line WLA and second group selecting word line WLB are arranged parallel to each other. This arrangement allows the different groups of memory cells selected by the outputs of the two different decoders to be arranged in a mixed state with ease. The way how the semiconductor integrated circuit device shown in FIGS. 5 and 6 works will be described.

Figure 9:
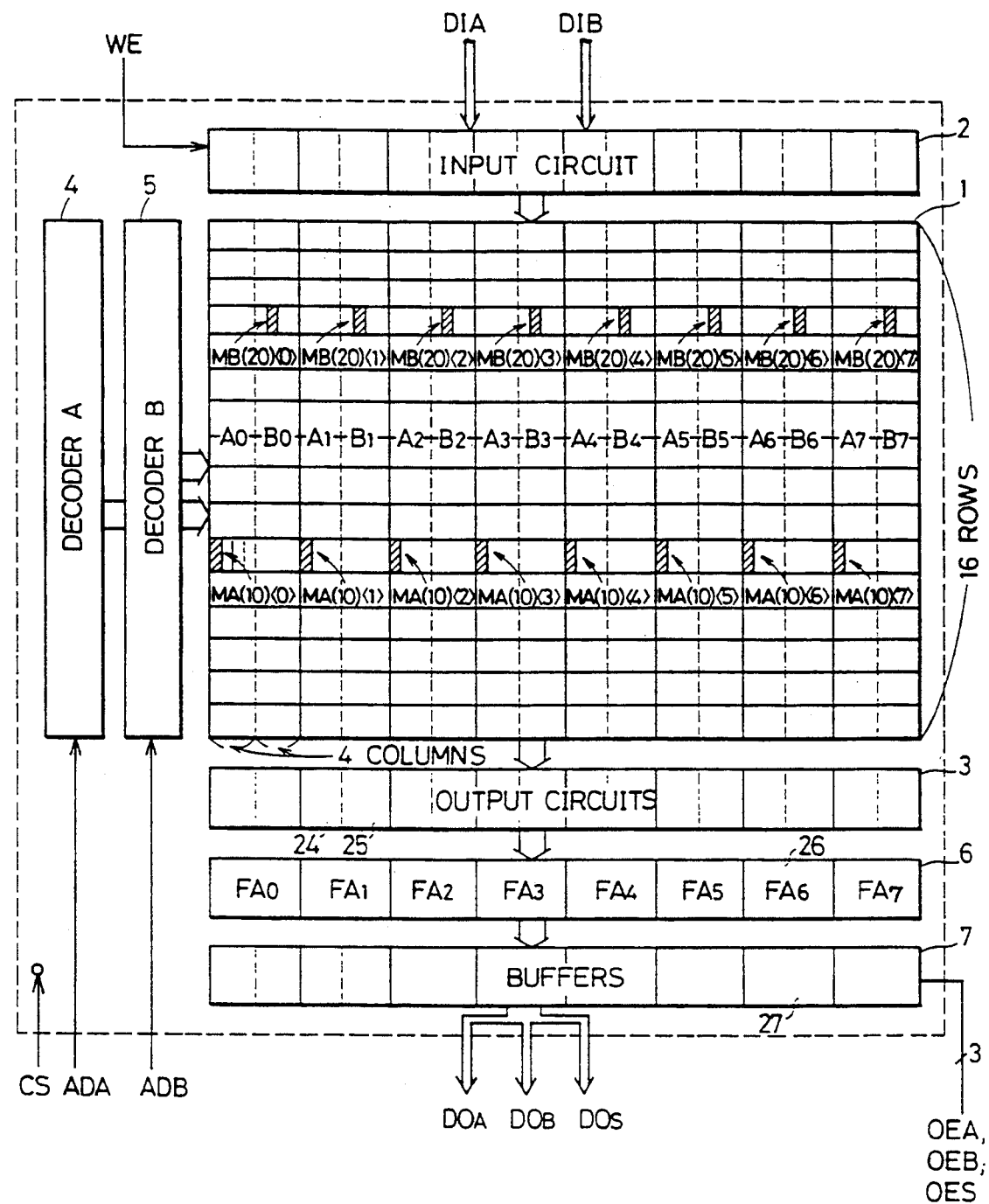
FIG. 9 is a diagram showing an example of word selecting modes in the semiconductor integrated circuit device shown in FIG. 5.

In order to render the description specific, it is assumed that the array of the first group A and the array of the second group B of this semiconductor integrated circuit device store 64 words (1 word: 8 bits), respectively. The memory cell array 1 is assumed to have 16 rows. In this case, four words are connected in one row. FIG. 9 shows a specific structure embodying the above assumptions.

In FIG. 9, the memory cell array 1 has 16 rows, and each of the bit arrays Ai and Bi is comprised of 4 columns by 16 rows. The four columns in each of the bit arrays Ai and Bi store data of the same digit in different words. The bit array Ai and bit array Bi are arranged alternately for the respective bits in the words. That is, the bit arrays are arranged in the otter of Ai−1, Bi−1, Ai, Bi, Ai+1 and Bi+1.

The lth bit subarray in the memory cell array 1 includes a bit array Al of the first group A and a bit array Bl of the second group B. That is, the lth bit subarray in the memory cell array 1 has eight columns. Thus, the memory cell array 1 provides 16 rows by 64 columns.

The output circuit 3 includes a total of eight unit output circuits (sense amplifier pairs) 30 since the unit output circuits 30 are arranged to correspond to the respective bit subarrays in the memory cell array 1. Similarly, the operational circuit 6 includes eight adding circuits 26 corresponding to the respective bit subarrays in the memory cell array 1. The group of tri-state buffers 7 in the output section includes eight sets of the three tri-state buffers TBA, TBS and TBB corresponding to the respective bit subarrays in the memory cell array 1. It is assumed here that the first address ADA shows the address 10 while the second address ADB shows the address 20. "Zero" address designates the zeroth row and zeroth column in the bit arrays, the address 15 designates the 15th row and 1st column, and the address 16 designates the zeroth row and 1st column.

In this case, the decoder A 4 selects word MA(1-0)<7:0> at No. 10 address from each respective bit array Ai of the first group. The "<7:0>" above signifies an 8-bit data having a data bit A0 as the least significant bit and a data bit A7 as the most significant bit. Each respective bits in the word MA(10) are arranged in the same column in the bit arrays A0-A7 (the zeroth column in FIG. 9).

When the second address ADB indicates the address 20, the decoder B 5 selects memory cells at the fourth row and first column in the bit arrays B0-B7 of the second group B.

As a result, a word MB(20)<7:0> is selected. The data bits in one word are arranged in the same row and the same column in the respective bit arrays.

The A decoder 4 and B decoder 5 receive the addresses ADA and ADB in 6 bits. The lower 4 bits are used to select one row, while the upper 2 bits are used to generate the Y decode signal to select one column from each of the bit arrays Ai and Bi, for example.

In a data writing, the input data DIA and DIB are written into the selected words (memory cells at designated addresses) MA(10) and MB(20) through the input circuit 2 and selectors 22b and 23b. This data writing is effected in response to the write enable signal WE. Data reading from the memory cell array 1 and operations of the operational circuit 6 will be described next.

In the following description, the data word stored in the address ADA in the first group A is indicated by the term MA(ADA) while the data word stored in the address ADB in the second group B is indicated by MB(ADB).

It is assumed that the memory cells at No. 10 address in the first group A store the data word MA(10) of "00001010(2); decimal number 10", while the memory cells at No. 20 address in the second group B store the data word MB(20) of "00010100(2); decimal number 20". The "(2)" above shows a binary number. That is, MA(10)<7:0>=00001010(2), and MB(20)<7:0>=00010100(2) in the case assumed here. The positions at No. 10 address in the first group and positions at No. 20 address in the second group are shown in hatched blocks in FIG. 8. FIG. 9 shows a structure including bit arrays A1 and B1 storing second bit data of the data words MA(10) and MB(20).

Figure 10:
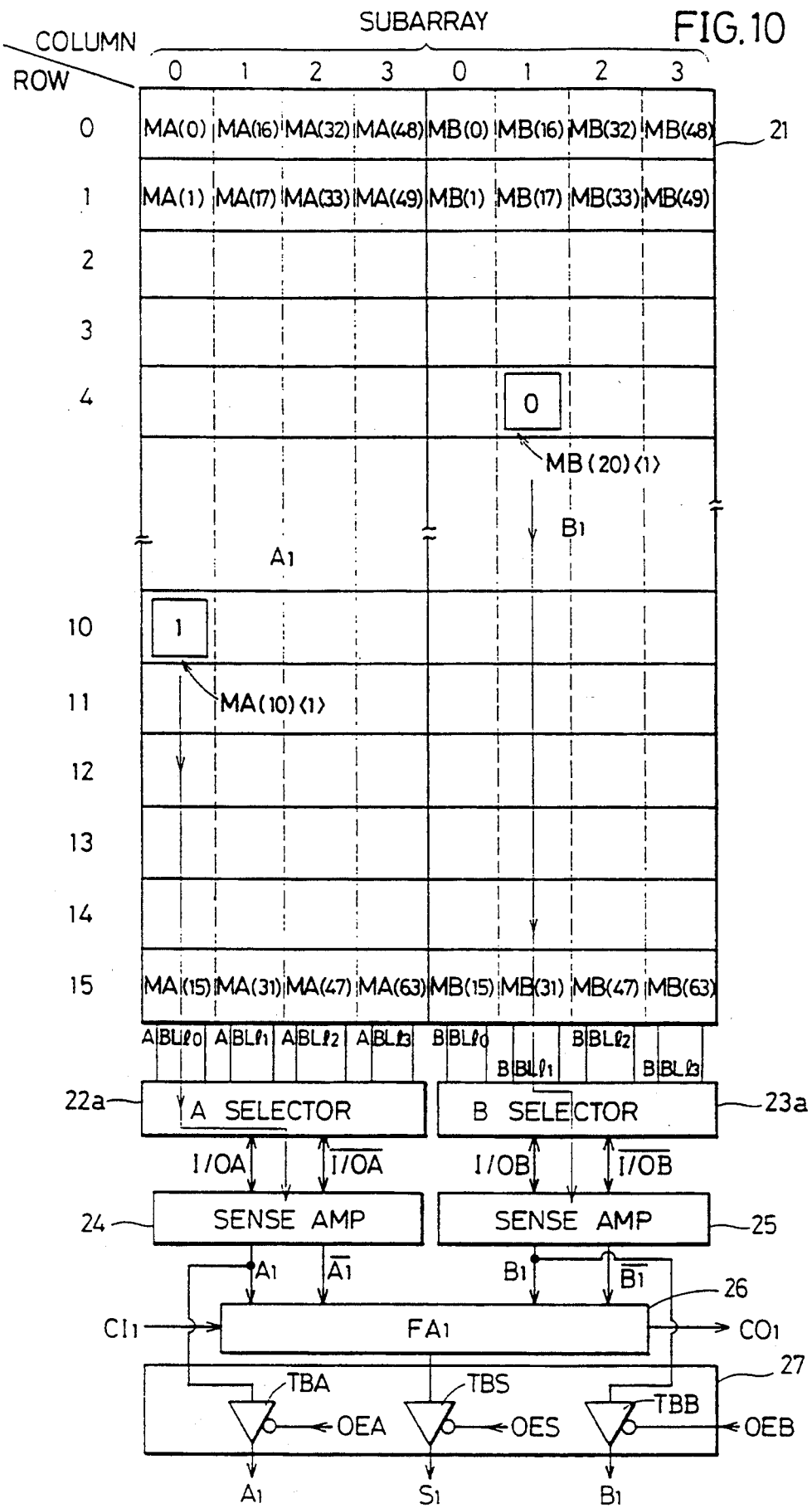
FIG. 10 is a diagram used in illustrating a mode of reading a 1-bit word data in the semiconductor integrated circuit device shown in FIG. 8.

In FIG. 10, the bit array A1 has the second bit data MA(0)<1> of the zero address data MA(0) stored in the zeroth row and zeroth column in FIG. 10, and at the bottom of the array the second bit data MA(15)<1> of No. 15 address data MA(15) stored in the zeroth row and 15th column. The first column stores the second bit data MA(16)<1> of the No. 16 address data MA(16), and in the ascending order of addresses up to the fifteen row where the second bit data MA(31)<1> of No. 31 address data MA(31) is stored. Thus, the second bit data MA(63)<1> of No. 63 address data MA(63) is stored in the third column and 15th row. Similarly, in the bit array B1 of the second group, the addresses are arranged in ascending order from the zeroth column and zeroth row to the third column and 15th row, for storing the second bit data MB(0)<1> of the zero address data MB(0) up to the second bit data MB(63)<1> of No. 63 address data MB(63). In FIG. 10, therefore, with the above data stored, data "1" is stored at No. 10 (10th row and zeroth column) in the bit array A1 as the second bit data MA(10)<1> of No. 10 address. Data "0" is stored in the fourth row and first column in the bit array B1 as the second bit data MB(20)<1> of No. 20 address.

The addresses ADA and ADB applied to the decoder A 4 and decoder B 5 are the binary notations of the addresses No. 10 and No. 20, respectively, which are;
ADA=001010, and
ADB=010100.
The upper 2 bits in these 6-bit addresses are used to select one column from the bit arrays Ai and Bi. That is, these upper 2-bit addresses are applied to column selecting decoders (Y decoders) included in the decoder A 4 and decoder B 5. These Y decoders apply Y decode signals as select signals to the selectors 22a, 22b, 23a and 23b. Consequently, the upper 2 bits "00" in the first address ADA cause the selectors 22a and 22b to select the zeroth column in the bit array Ai of the first group A. The upper 2 bits "01" in the second address ADB cause the selectors 23a and 23b to select the first column in the bit array Bi of the second group B.

The lower 4 bits in the addresses ADA and ADB are applied to and decoded by row selecting X decoders of the decoder A 4 and decoder B 5, respectively. That is, the lower 4 bits "1010" in the first address ADA lead to selection of the 10th row in the bit array Ai of the first group A. The lower 4 bits "0100" in the second address ADB lead to selection of the fourth row in the bit array Bi of the second group B. Consequently, the memory cells shown in box marks in FIG. 10 are selected.

The data in the box marks in FIG. 10 are read as follows.

First, in response to the chip select signal CS, the decoder A 4 and decoder B 5 decode the first address ADA and second address ADB, respectively. As a result, all the memory cells in the 10th row in the bit array Ai of the first group A are placed in the selected state, and so are all the memory cells in the fourth row in the bit array Bi of the second group B. The memory cell data in the selected rows are transmitted to the corresponding bit lines ABLl0–ABLl3 and BBLl0–BBLl3, respectively.

Next, the A selector 22a and B selector 23a operate in response to the column select signals (Y decode signals) from the decoder A 4 and decoder B 5, to select the bit line ABLl0 of the zeroth column in the bit array Ai (A1 in FIG. 9), and connect this selected bit line ABLl0 (which is a complementary bit line pair ABLl0 and $\overline{\text{ABLl0}}$, more precisely) to the bus line pair I/OA and $\overline{\text{I/OA}}$.

The B selector 23a also selects the bit line BBLl1 (and the complementary bit line $\overline{\text{BBLl1}}$) of the first column in the bit array Bi (B1 in FIG. 9), and connects it to the bus line I/OB (and $\overline{\text{I/OB}}$).

Subsequently, the memory cell data selected by the A selector 22a and B selector 23a are amplified by the sense amplifier circuits 24 and 25 constituting the output circuit 3 and corresponding to each bit subarray in the memory cell array 1. The memory cell data Ai, $\overline{\text{Ai}}$ and Bi, $\overline{\text{Bi}}$ amplified by the respective sense amplifier circuits of the output circuit 3 are applied to the operational unit 6 and to the tri-state buffers TBA and TBB included in the group of tri-state buffers 7 and corresponding to each bit subarray in the memory cell array 1.

The adding circuit or full adder 26 arranged to correspond to each bit subarray in the memory cell array 1 receives the data Ai and Bi from the corresponding output circuit (sense amplifier pair 24 and 25), and a carry output of a lower bit as carry input CIi, adds up all the received data, and outputs data Si showing a result of addition and carry COi. In FIG. 10, the full adder 26 receives a carry output of a lower bit full adder as a carry input CI1, and outputs a result of addition S1 and a carry output CO1. The sum output Si from this operational circuit (full adder) 26 is applied to the output tri-state buffer TBS included in the group of tri-state buffers 7.

The group of tri-state buffers 7 is placed in an output enable state by the output enable signals OEA, OEB and OES, thereby setting the outputs having been maintained in the high impedance state to the states corresponding to the data applied. The operational circuit (full adder) 26 of the least significant bit has a carry input CI0 set to zero which is the ground potential level. By changing the output enable signals OEA, OEB and OES to the enable state, the group of tri-state buffers 7 outputs the data DOA of the selected word in the first group A, the data DOB of the selected word in the second group B and the result output DOS of the operational circuit 6 to an external of the device. A specific data processing operation will be described with reference to FIG. 9. Since FLA(10)<7:0>=00001010, MA(10)<1>=1.

Further, since F1A(20)<7:0>=00010100, MA(20)<1>=0.

The data "1" of the selected bit in the bit array A1 and the data "0" of the selected bit in the bit array B1 are selected by the A selector 22a and B selector 23a, and transmitted to the corresponding sense amplifier circuits 24 and 25. The sense amplifier circuits 24 and 25 amplify the data "1" and "0" applied thereto, respectively, and apply them to the operational circuit (full adder FA1) 26 corresponding to the second bit.

The carry input CI1 to the operational circuit (full adder FA1) 26 corresponding to the second bit is "0". The reason is that input data AO and BO to the operational circuit (full adder FA0) 26 corresponding to the first bit are both "0" and no carry is produced from the operational circuit (full adder FA0) 26 for the first bit. As a result, the operational circuit (full adder FA0) 26 for the first bit provides a sum output S1 "1" and carry CP1 "0". In the structure shown in FIG. 8, the operational unit 6 adds the input data MA(10) and input data MB(20), and outputs the result of addition to the tri-state buffers 7. The result of addition is;

```
   00001010
+) 00010100
   00011110
```

The group of tri-state buffers 7 outputs the signals applied thereto when the incoming output enable signals OEA, OEB and OES change to the enable state. Thus,
DOS=00011110,
DOA=00001010, and
DOB=00010100.

Since the data of the words selected in the first group A and second group B are also output, these processed data may also be monitored externally when the result of operation is output. This provides a very versatile semiconductor integrated circuit device.

By maintaining the output enable signal OES in the disable state with only the output enable signals OEA and OEB changed to the enable state, only the memory cell data of the selected words in the first group A and second group B may be output. Then, this semiconductor integrated circuit device may be used as a buffer memory device.

In the construction described above, the output circuit 3 and input circuit 2 are provided separately so that, for digital signal processing, for example, data input and data reading may be carried out independently. However, the input circuit 2 and output circuit 3 may be connected to the same data input/output node. Then, in the construction shown in FIG. 6, the A' selector 22b is combined with the A selector 22a and the B' selector 23b with the B selector 23a, and the input buffers AIB and BIB for outputting the internal input data in response to the enable signal WE are connected to the combined selectors through the data bus lines I/OA, $\overline{I/OA}$ and I/OB, $\overline{I/OB}$, respectively. This construction has input and output sections similar to those in an ordinary static random access memory.

The foregoing embodiment has been described exemplifying the case in which the memory is a random access memory for data writing and reading and for data rewriting as well. The same effect may be produced where the semiconductor integrated circuit device is a read only memory for storing program data.

In the foregoing embodiment, the bit arrays include a plurality of columns. This is applicable to the case where a plurality of words are connected in one row of the memory cell array. The same effect may be produced as in the foregoing embodiment if one row includes only one word, i.e. the bit arrays each have one column.

Further, in the foregoing embodiment, the operational circuit includes full adders. Instead, the operational circuit may be comprised of any elements having a bit slice structure, such as adder/subtracters, arithmetic and logic units (ALU) or multipliers, to produce the same effect as in the described embodiment.

Further, the memory for storing two kinds of data and the operational circuit for outputting these data have been described in the foregoing embodiment. However, an accumulator circuit may be provided by utilizing the construction according to this invention.

Figure 11:
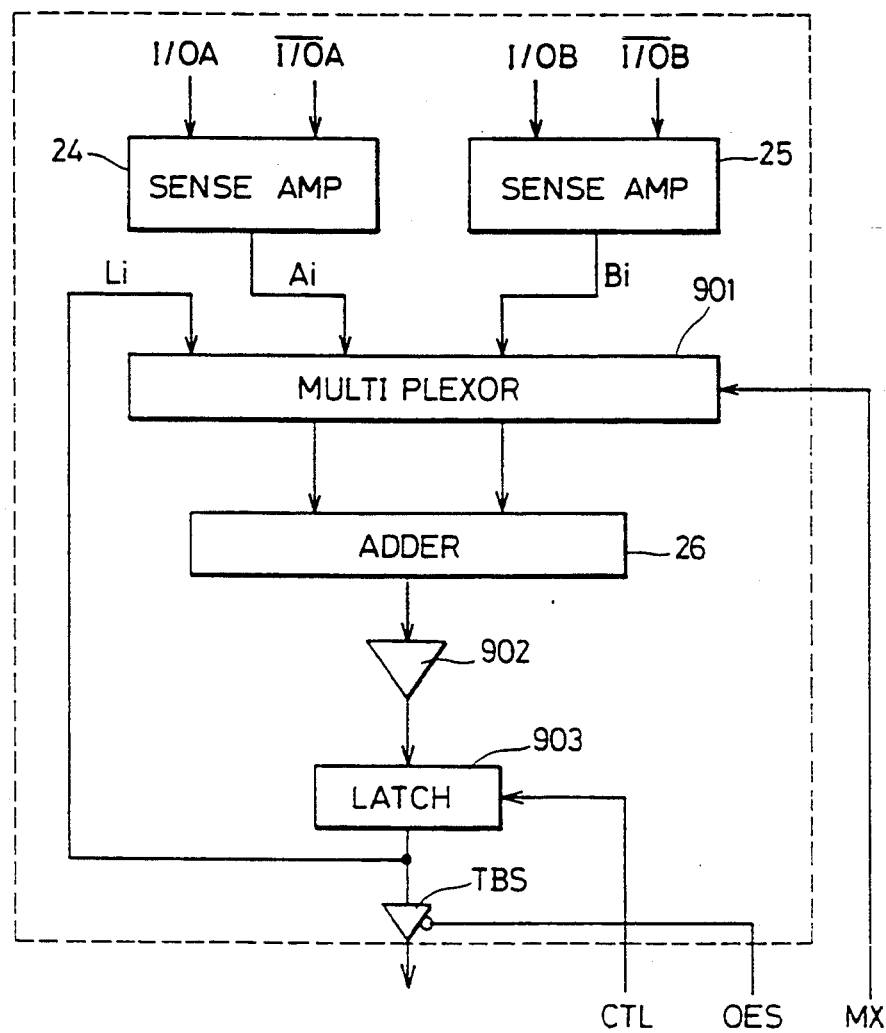
FIG. 11 is a diagram schematically showing a data reading section of a semiconductor integrated circuit device according to another embodiment of this invention.

FIG. 11 is a diagram schematically showing a data output section of a semiconductor integrated circuit device in another embodiment of this invention. In FIG. 11, the semiconductor integrated circuit device has data output circuitry corresponding to bit arrays, and including a multiplexer 901 for allowing passage of two of output data Ai and Bi of sense amplifier circuits 24 and 25 corresponding to the unit output circuits 30 and an output data Li of a latch circuit 903, a full adder 26 for adding output data from the multiplexer 901, a buffer circuit 902 for buffer-processing output of the full adder 26, and the latch circuit 903 for latching output of the buffer circuit 902. The multiplexer 901, full adder 26, buffer circuit 902 and latch circuit 903 correspond to a unit operational circuit in the operational unit 6 shown in FIG. 5. The multiplexer 901 allows passage of two data out of the three inputs Ai, Bi and Li in response to a multiplex control signal MX. The latch circuit 903 latches the output of the buffer circuit 902 and outputs it to a tri-state buffer TBS in response to a control signal CTL. Now, an operation of the integrated circuit device shown in FIG. 11 will be described briefly in relation to one-bit accumulation.

It is assumed that the multiplexer 901 is set by the multiplex control signal MX to a state for allowing passage of the output data Ai of the sense amplifier circuit 24 and the output data Li of the latch circuit 903. The full adder 26 adds input data Ai and Li, and applies the result to the buffer circuit 902. The latch circuit 903 has its latch timing determined by the control signal CTL. The latch circuit 903 carries out a latching operation after the data of a selected word in the first group A is read out from the memory cell array 1 and added in the full adder 26. With this operation repeated, the data Li latched by the latch circuit 903 is;

$$\Sigma Ai = Li,$$

thereby effecting an accumulating operation for the word selected in the first group A. The data latched by the latch circuit 903 is output through the tri-state buffer TBS externally at an appropriate timing in response to the output enable signal OES.

When the multiplexer 901 is set by the control signal MX to a state for selecting the outputs Ai and Bi of the sense amplifier circuits 24 and 25, an operational circuit for carrying out ordinary additions may be obtained. Then, the latch circuit 903 may effect a latching operation synchronized with the data output from the adder 26, or may be set to a through state for passing the data without latching them. Alternatively, a bypass circuit may be provided for allowing the output of the adder 26 to bypass the latch circuit 903, with the latch circuit 903 maintained in a disable state (output high impedance state) and the bypass circuit in an enable state. In either case, the data Ai and data Bi may be added and the result of addition is output.

While the buffer circuit 902 is provided between the adder 26 and latch circuit 903, this buffer circuit 902 is provided to assure a reliable latching operation of the latch circuit 903 and may be dispensable.

In performing an accumulating operation for a selected word in the first group A or second group B, the word data from one group are unnecessary. In this case, a word selection from the unnecessary group may be prohibited or a selection operation may be effected by applying an appropriate address.

Where the construction shown in FIG. 11 is used exclusively as an accumulator, the words of both the first group A and second group B need not be stored in the memory cell array 1. In this case, an integrated circuit device for exclusive use as an accumulator circuit may be obtained by storing only the words of one group in the memory cell array 1 and providing adders 26 and latch circuits 903 corresponding to the bits in the words.

Figure 12:
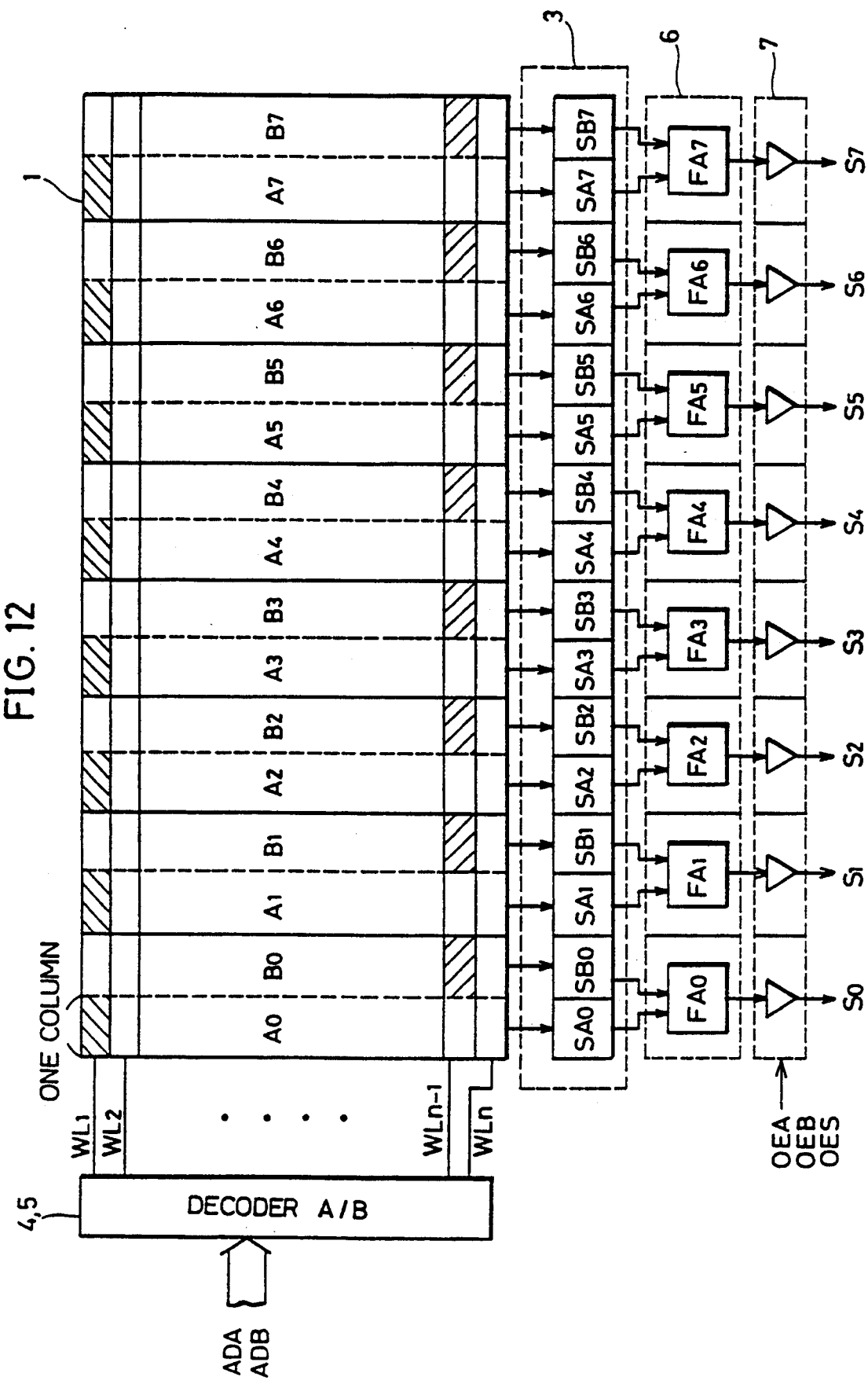
FIG. 12 is a diagram schematically showing an arrangement according to another embodiment of the present invention.

In the above described embodiment, each of the bit arrays Ai and Bi comprises 4 columns because 4 words are stored on one row. If one row stores only one word, bit array Ai and Bi each include one column, as shown in FIG. 12. In FIG. 12, decoder DE is shown including A decoder 4 and B decoder 5. In the arrangement of FIG. 12, decoder 4, 5 only select one row for each of the groups A and B, and do not perform column selection. Each column of each bit array (Ai, Bi) is connected to sense amplifiers SA0 through SA7 and SB0 through SB7 provided for respective bit arrays A0 through A7 and B0 through B7. Sense amplifiers SA0 through SA7 and SB0 through SB7 are activated at an appropriate timing by a control circuit (not specifically shown) which may generate the control signals OEA, OEB and OES.

In FIG. 12, although full adders FA0 through FA7 and three-state buffers for the full adders FA0 through FA7 are shown, the circuit block 6 may include multiplexer MUX as shown in FIG. 11, and the block 7 also includes the three-state buffers for receiving memory cell data from the associated bit array.

The foregoing embodiments have been described as having memory cells of the two kinds of groups A and B mixedly arranged in the memory cell array. The same effect may be produced as in the described embodiment even if memory cells of three or more groups are mixedly arranged in one memory cell array.

In this invention, as described above, the data of words in a plurality of groups are divided into bit arrays in one memory cell array and arranged alternately, with memory cells of each group being selected by a different address. An operational circuit is also provided for effecting a predetermined operation on the data read from the memory cell array. As a result, regularity in the layout of the semiconductor integrated circuit device is greatly improved, thereby providing a highly dense and highly integrated semiconductor integrated circuit device having a small occupying area.

According to this construction, the data read from the memory cell array are transmitted to the operational unit through interconnection of minimal lengths. This feature minimizes signal delays and provides a semiconductor integrated circuit device capable of high speed processing.

Further, by collecting and alternately arranging, as bit arrays, corresponding bits in the data words of a plurality of groups, operational circuits may be arranged to correspond to the respective bit arrays. Thus, the memory cell arrays and operational circuits may be arranged in a bit slice structure, to provide a semiconductor integrated circuit device having a layout with a greatly improved regularity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a memory cell array including a plurality of memory cell groups, each of said memory cell groups including a plurality of bit arrays each having memory cells arranged in a matrix form of at least one column and a plurality of rows, the memory cells of each of said plurality of bit arrays of said plurality of memory cell groups being arranged adjacent to the memory cells of a bit array of another memory cell group;
   a plurality of selecting means provided corresponding to said plurality of memory cell groups in said memory cell array, respectively, and responsive to address signals applied independently for said groups for selecting memory cells designated by said address signals from corresponding memory cell groups; and
   operational means, responsive to a stored information read out from the memory cells in at least one memory cell group for performing a predetermined operation.

2. A semiconductor integrated circuit device according to claim 1, wherein said operational means includes a plurality of operational circuits provided corresponding to respective bit arrays of said memory cell groups.

3. A semiconductor integrated circuit device according to claim 2, wherein each of said plurality of memory cell groups stores a different group of data words, each data word including a plurality of data bits,
   each bit array in a corresponding memory cell group stores data bits of an identical digit of the data words, and
   bit arrays storing the data bits of the identical digit are arranged adjacent one another to provide one subarray in said memory cell array.

4. A semiconductor integrated circuit device according to claim 1, wherein said bit arrays store corresponding data bits of one data word in identical storage positions.

5. A semiconductor integrated circuit device according to claim 3, further comprising data input means provided corresponding to said plurality of groups, respectively, for receiving input data for corresponding groups, said data input means including input circuits provided corresponding to said bit arrays, respectively.

6. A semiconductor integrated circuit device according to claim 5, wherein said selecting means include selectors each disposed between one of said input circuits and a corresponding bit array, each of said selectors being responsive to a related applied address signal to connect a column in a corresponding bit array to a corresponding input circuit.

7. A semiconductor integrated circuit device according to claim 3, further comprising data output circuits one corresponding to each of said bit arrays for transmitting the data of selected memory cells in a corresponding bit array to a corresponding input circuit.

8. A semiconductor integrated circuit device according to claim 7, wherein said selecting means include selectors one corresponding to each of said bit arrays, each of said selectors being responsive to a related address signal to connect one column in a corresponding bit array to a corresponding output circuit.

9. A semiconductor integrated circuit device according to claim 2, further comprising buffer circuits one corresponding to each of said operational circuits, and responsive to an output control signal to transmit output of a corresponding operational circuit, each said buffer circuit changing its output to an output high impedance state when disabled.

10. A semiconductor integrated circuit device according to claim 2, further comprising buffer circuits one corresponding to each of said bit arrays, and responsive to an output control signal to output the data of selected memory cells in a corresponding bit array with a corresponding operational circuit bypassed.

11. A semiconductor integrated circuit device according to claim 3, wherein said plurality of operational circuits include adders provided corresponding to said subarrays for adding the data of selected memory cells in the bit arrays included in corresponding subarrays.

12. A semiconductor integrated circuit device according to claim 11, further comprising multiplexer circuits each disposed between each respective said operational circuits and each respective said subarrays, each of said multiplexer circuits being responsive to a select signal for selectively allowing passage of two data selected from (i) an output of a corresponding operational circuit and (ii) data from the output of a respective bit array in a corresponding subarray, to a corresponding operational circuit.

13. A semiconductor integrated circuit memory device on a single chip, comprising:
a single array of memory cells arranged in a matrix of rows and columns, said memory cell array divided into first and second groups of memory cell columns, each group of memory cell columns comprising a plurality of bit arrays each formed of a predetermined number of columns of memory cells in adjacent positions, the predetermined number of columns of memory cells in adjacent positions comprising each of the bit arrays of said first group being interdigitated alternately with the predetermined number of columns of memory cells in adjacent positions comprising each of the bit arrays of said second group, first and second means corresponding respectively to said first and second groups and each responsive to an address signal for selecting one of said rows of memory cells for each group and for selecting one memory cell in each bit array in a selected row in each said group for access, each such selected cell located in the same column position in the respective bit array;
reading means for reading data stored in selected cells; and
operational means comprising a plurality of operational circuits, each corresponding to a respective bit array, for performing a predetermined operation on data provided by said reading means.

14. A semiconductor integrated circuit memory device as recited in claim 13, wherein said operational circuits comprise adding circuits for adding data provided by said reading means from said first Group with data provided by said reading means from said second group.

15. A semiconductor integrated circuit memory device as recited in claim 13, further comprising multiplexer means for receiving data from both said groups provided by said reading means, said multiplexer means having an output connected to said operational means.

16. A semiconductor integrated circuit device comprising:
a memory cell array including a plurality of memory cell groups, each of said memory cell groups including a plurality of bit arrays each having memory cells arranged in a matrix form of at least one column and a plurality of rows, the memory cells of each of said plurality of bit arrays of said plurality of memory cell groups being arranged adjacent to the memory cells of a bit array of another memory cell group;
a plurality of selecting means provided corresponding to said plurality of memory cell groups in said memory cell array, respectively, and responsive to address signals applied independently for said groups for selecting memory cells designated by said address signals from corresponding memory cell groups; and
a plurality of operation circuits each provided corresponding to respective bit arrays of the memory cell groups.

17. A semiconductor integrated circuit device according to claim 16, wherein each of said plurality of memory cell groups stores a different group of data words, each data word including a plurality of data bits,
each bit array in a corresponding memory cell group stores data bits of an identical digit of the data words, and
bit arrays storing the data bits of the identical digit are arranged adjacent one another to provide one subarray in said memory cell array.

18. A semiconductor integrated circuit device according to claim 17, further comprising data input means provided corresponding to said plurality of groups, respectively, for receiving input data for corresponding groups, said data input means including input circuits provided corresponding to said bit arrays, respectively.

19. A semiconductor integrated circuit device according to claim 18, wherein said selecting means include selectors each disposed between one of said input circuits and a corresponding bit array, each of said selectors being responsive to a related applied address signal to connect a column in a corresponding bit array to a corresponding input circuit.

20. A semiconductor integrated circuit device according to claim 17, further comprising data output circuits one corresponding to each of said bit arrays for transmitting the data of selected memory cells in a corresponding bit array to a corresponding bit array to a corresponding input circuit.

21. A semiconductor integrated circuit according to claim 20, wherein said selecting means include selectors one corresponding to each of said bit arrays, each of said selectors being responsive to a related address signal to connect one column in a corresponding bit array to a corresponding output circuit.

22. A semiconductor integrated circuit device according to claim 17, wherein said plurality of operational circuits include adders provided corresponding to said subarrays for adding the data of selected memory cells in the bit arrays included in corresponding subarrays.

23. A semiconductor integrated circuit device according to claim 22, further comprising multiplexer circuits each disposed between each respective said operational circuits and each respective said subarrays, each of said multiplexer circuits being responsive to a select signal for selectively allowing passage of two data selected from (i) an output of a corresponding operational circuit and (ii) data from the output of a respective bit array in a corresponding subarray, to a corresponding operational circuit.

24. A semiconductor integrated circuit device according to claim 16, wherein said bit arrays store corresponding data bits of one data word in identical storage positions.

25. A semiconductor integrated circuit device according to claim 16, further comprising buffer circuits one corresponding to each of said operational circuits, and responsive to an output control signal to transmit output of a corresponding operational circuit, each said buffer circuit changing its output to an output high impedance state when disabled.

26. A semiconductor integrated circuit device according to claim 16, further comprising buffer circuits one corresponding to each of said bit arrays, and responsive to an output control signal to output the data of selected memory cells in a corresponding bit array with a corresponding operational circuit bypassed.

27. A semiconductor integrated circuit device comprising:
a memory cell array including a plurality of memory cell groups, each of said memory cell groups including a plurality of bit arrays with each bit array having memory cells arranged in a matrix form of a plurality of rows and a plurality of columns, the memory cells of each of said plurality of bit arrays of said plurality of memory cell groups being arranged adjacent to the memory cells of a bit array of another memory cell group;
a plurality of selecting means each provided corresponding to each bit array of each memory cell group in said memory cell array for selecting one column in each bit array, and responsive to address signals applied independently for said groups for selecting memory cells designated by said address signals from corresponding memory cell groups; and
a plurality of operation circuits each provided corresponding to the bit arrays of each group having the same column position.

28. The semiconductor integrated circuit device according to claim 27, further including a plurality of amplifier means each provided corresponding to each bit array of each memory cell group in said memory cell array and connected between a respective selecting means and operational circuit.

29. A semiconductor integrated circuit device according to claim 27, wherein each of said plurality of memory cell groups stores a different group of data words, each data word including a plurality of data bits,
each bit array in a corresponding memory cell group stores data bits of an identical digit of the data words, and
bit arrays storing the data bits of the identical digit are arranged adjacent one another to provide one subarray in said memory cell array.

30. A semiconductor integrated circuit according to claim 29, further comprising data input means provided corresponding to said plurality of groups, respectively, for receiving input data for corresponding groups, said data input means including input circuits provided corresponding to said bit arrays, respectively.

31. A semiconductor integrated circuit device according to claim 30, wherein said selecting means include selectors each disposed between one of said input circuits and a corresponding bit array, each of said selectors being responsive to a related applied address signal to connect a column in a corresponding bit array to a corresponding input circuit.

32. A semiconductor integrated circuit device according to claim 27, further comprising data output circuits one corresponding to each of said bit arrays for transmitting the data of selected memory cells in a corresponding bit array to a corresponding bit array to a corresponding input circuit.

33. A semiconductor integrated circuit according to claim 27, wherein said selecting means include selectors one corresponding to each of said bit arrays, each of said selectors being responsive to a related address signal to connect one column in a corresponding bit array to a corresponding output circuit.

34. A semiconductor integrated circuit device according to claim 27, wherein said plurality of operational circuits include adders provided corresponding to said subarrays for adding the data of selected memory cells in the bit arrays included in corresponding subarrays.

35. A semiconductor integrated circuit device according to claim 27, further comprising multiplexer circuits each disposed between each respective said operational circuits and each respective said subarrays, each of said multiplexer circuits being responsive to a select signal for selectively allowing passage of two data selected from (i) an output of a corresponding operational circuit and (ii) data from the output of a respective bit array in a corresponding subarray, to a corresponding operational circuit.

36. A semiconductor integrated circuit device according to claim 27, wherein said bit arrays store corresponding data bits of one data word in identical storage positions.

37. A semiconductor integrated circuit device according to claim 27, further comprising buffer circuits one corresponding to each of said operational circuits, and responsive to an output control signal to transmit output of a corresponding operational circuit, each said buffer circuit changing its output to an output high impedance state when disabled.

38. A semiconductor integrated circuit device according to claim 16, further comprising buffer circuits one corresponding to each of said bit arrays, and responsive to an output control signal to output the data of selected memory cells in a corresponding bit array with a corresponding operational circuit bypassed.

* * * * *